United States Patent
Ullakko

(10) Patent No.: US 11,957,060 B2
(45) Date of Patent: Apr. 9, 2024

(54) OPERATIONAL ELEMENT COMPRISING MAGNETIC SHAPE MEMORY ALLOY AND A METHOD FOR MANUFACTURING IT

(71) Applicant: TIKOMAT OY, Savonlinna (FI)

(72) Inventor: Kari Ullakko, Savonlinna (FI)

(73) Assignee: TIKOMAT OY (FI)

(*) Notice: Subject to any disclaimer, the term of this patent is extended or adjusted under 35 U.S.C. 154(b) by 625 days.

(21) Appl. No.: 17/272,555

(22) PCT Filed: Aug. 28, 2019

(86) PCT No.: PCT/FI2019/050613
§ 371 (c)(1),
(2) Date: Mar. 1, 2021

(87) PCT Pub. No.: WO2020/043950
PCT Pub. Date: Mar. 5, 2020

(65) Prior Publication Data
US 2021/0328132 A1   Oct. 21, 2021

(30) Foreign Application Priority Data
Aug. 28, 2018 (FI) .................................. 20180095

(51) Int. Cl.
*H10N 35/00* (2023.01)
*B01L 3/00* (2006.01)
*C22C 19/00* (2006.01)
*C22F 1/10* (2006.01)
*F03G 7/06* (2006.01)
(Continued)

(52) U.S. Cl.
CPC .......... *H10N 35/00* (2023.02); *B01L 3/50273* (2013.01); *C22C 19/005* (2013.01); *C22F 1/10* (2013.01); *F03G 7/06147* (2021.08); *H10N 35/01* (2023.02); *H10N 35/85* (2023.02); *B01L 2200/10* (2013.01); *C22C 2202/02* (2013.01); *F04B 43/04* (2013.01); *F16K 99/0046* (2013.01)

(58) Field of Classification Search
CPC ........ H10N 35/01; H10N 35/00; H10N 35/85; B01L 3/50273; B01L 2200/10; C22C 19/005; C22C 2202/02; C22C 19/03; C22F 1/10; F03G 7/06147; F03G 7/065; F03G 7/0614; F04B 43/04; F04B 43/043; F16K 99/0046; H01F 1/0308; H01F 1/0306; F05B 2280/5006
See application file for complete search history.

(56) References Cited

U.S. PATENT DOCUMENTS

2014/0041761 A1* 2/2014 Ezer .......................... C22F 1/00
                                                          148/300
2014/0299232 A1* 10/2014 Ezer ........................ C22C 22/00
                                                          148/120

FOREIGN PATENT DOCUMENTS

| CN | 110089021 B | * | 4/2022 | ........... F03G 7/0614 |
| DE | 102008027325 A1 | * | 2/2010 | ........... F16K 31/002 |
| WO | WO-2012117164 A1 | * | 9/2012 | ............... C21D 7/06 |

* cited by examiner

*Primary Examiner* — Mohamad A Musleh
(74) *Attorney, Agent, or Firm* — Edmonds & Cmaidalka, P.C.

(57) ABSTRACT

This invention relates to an operational element and a method for manufacturing the operational element that comprises magnetic shape memory alloy. in the method at least a part of the magnetic shape memory alloy is arranged as an active region that is responsive to a magnetic field and at least one other part of the magnetic shape memory alloy is arranged as an inactive region that is unresponsive to a magnetic field.

33 Claims, 5 Drawing Sheets

(51) Int. Cl.
 *H10N 35/01* (2023.01)
 *H10N 35/85* (2023.01)
 *F04B 43/04* (2006.01)
 *F16K 99/00* (2006.01)

OPERATIONAL ELEMENT COMPRISING MAGNETIC SHAPE MEMORY ALLOY AND A METHOD FOR MANUFACTURING IT

CROSS-REFERENCE TO RELATED APPLICATIONS

This is a National Stage Application under 35 U.S.C. § 371 of PCT/FI2019/050613, filed on Aug. 28, 2019, which claims priority to Finnish Patent Application having serial number 20180095, filed on Aug. 28, 2018, which is incorporated by reference herein.

BACKGROUND OF THE INVENTION

Field of the Invention

The invention relates to an operational element as defined in the preamble of claim 1 and a method for manufacturing the operational element as defined in the preamble of claim 16.

The operational element according to the invention comprises magnetic shape memory alloy material and is intended as an operational or functional element for various devices and apparatuses. In the operational element certain regions, defined here as active regions, can be actuated by means of the Magnetic Shape Memory (MSM) effect, and other regions are made inactive using special manufacturing methods so that those inactive regions do not strain in the applied magnetic field but they have other essential functions of apparatuses. Inactive regions may act as the housing of the device, springs, magnetic flux paths, grippers, valves, optical or electrical switches, fluidic chambers or channels, or parts of them. The invention is a solution in which local magnetic fields are used to create local changes to twin variant configurations on MSM materials in which the element may be constrained in parts. The operational element can be made from Ni—Mn—Ga or Ni—Mn—Ga-based alloys that currently show the best MSM performance. This invention will simplify complicated devices for various industrial applications such as in optics, fluidics, micro engineering and biomedical. The invention is of special importance in micro- and nano-scale devices, because the entire apparatus or an operational part of it containing several functional parts can be manufactured from one source piece of an MSM material.

Description of the Related Art

Magnetic Shape Memory (hereafter as MSM) alloys, or Ferromagnetic Shape Memory (FSMA) alloys are a unique material that can strain several percent when a magnetic field is applied to them. Strains in a sample made from an MSM alloy are based on magnetic-field-induced changes to the proportions of twin variants within the sample. The main group of MSM materials is Ni—Mn—Ga alloys. The MSM material consists of at least two twin variants that are separated by a twin boundary. The material must have a sufficiently high magnetocrystalline anisotropy energy and a low twinning stress so that, when an external magnetic field of sufficient strength and direction is applied to the material, its easy direction of magnetization and crystallographic axes change in accordance to the magnetic field. The material must contain two crystallographic directions whose lattice parameters are a and c, the c axis being the shorter axis. Such a material is, for instance, the 10M martensite of Ni—Mn—Ga. In this example, the c axis is the easy direction of magnetization of the material. The plane in which the direction of magnetization switches is hereafter referred to as the active plane. The ratio of the volume of a twin variant in relationship to the volume of the entire material is defined as the volume fraction of said twin variant. This invention is not limited to the alloy Ni—Mn—Ga or other Heusler alloys. The type of twin variants can vary depending upon the material. When the crystallography is, for instance monoclinic, orthorhombic or tetragonal, the type of twin variants in the material can also be different, e.g., type I and type II twins. These twins have different properties, such as their twinning stress and their required magnetic field energy to switch between twin variants. Hereafter, magnetic shape memory alloy or MSM alloy is defined as a material in which the MSM effect occurs, i.e., its shape can be changed by applying on it a magnetic field of sufficient strength and appropriate direction.

MSM materials have considerable commercial potential due to their ability to strain both quickly and precisely from an energy source that is not connected to the material. MSM devices exhibit significant commercial potential in micro- and nano-scale devices due to a lack of suitable active technologies that can produce large strokes in micro and nano devices. Rotary and linear electric motors cannot be scaled down to micrometer size, and piezo electric or magnetostrictive materials produce very small strokes only about one percent of the maximal strokes of MSM materials made from Ni—Mn—Ga alloys. The efficiency (mechanical work output/magnetic field energy) of the MSM effect can be over 95%, and fatigue life exceeds 2 billion cycles. It was recently demonstrated actuating velocity of 4 m/s and acceleration of over a million $m/s^2$ in Ni—Mn—Ga, which is assumed to be the highest acceleration of all actuator materials. Small-scale MSM devices benefit best from the high actuating velocity and acceleration because the actuation velocity and acceleration are mostly limited by the inertia of the moving part of the MSM element. Larger MSM devices are slower than small devices.

Current MSM devices contain separate functional parts, such as a magnetic field path (yoke), springs, housing, and operational parts like grippers, clamps, valves, electrical switches, etc. Assembling all these parts in a small scale is a difficult and expensive process, and sometimes not possible at all. It is also very difficult to prepare a proper twin structure in tiny MSM samples and assemble those elements precisely into micro devices. The invention solves the problems described above. The entire apparatus according to the invention or an operational element of the apparatus can be manufactured from one source piece of alloy i.e. MSM material. The manufactured apparatus contains the active region(s) and may also contain other functional parts, such as housing, magnetic flux paths, springs, and also some operational parts like grippers, clamps or switches. The invention will simplify many apparatuses across a variety of industrial applications by replacing separate functional parts that are currently complicated machinery.

SUMMARY OF THE INVENTION

The invention comprises a method for configuring twin variants and is related to an operational element made from an MSM material where a magnetic field is applied to, at least, one region of the apparatus for configuring the twin variants. In this region, called also as active region of the apparatus or region responsive to a magnetic field, the shape of that region is changed by the applied magnetic field. Other regions of the apparatus are treated or manufactured in such a way that the MSM effect does not occur in those regions, i.e., the shape of those regions is not changed by the applied magnetic field. Those inactive regions of the apparatus or regions unresponsive to a magnetic field can act as springs, magnetic flux paths, housing of the machine or other functional parts, such as grippers, clamps, manipulators, injectors, mixers, pumps, valves, manifolds, electrical or optical switches. The local magnetic fields applied to the active regions or parts of them are generated, for instance, by at least one electromagnet or at least one permanent magnet. This invention will simplify many devices across a variety of industrial applications by replacing complicated machinery. Examples of the application areas are optics, electronics, fluidics, micro engineering and biomedical. Inactive regions can be made using special surface treatments, or coating the surfaces with stiff enough substances, as well as other methods. The inactive regions can also be made by pressing or clamping.

A predetermined volume fraction of twin variants within the source piece of an MSM material can be created by mechanical force or by a magnetic field, prior to manufacturing an operating element from the source piece of the MSM material. Thereafter, an operating element is manufactured from the source piece of the MSM material. Thereafter, those regions in the operating element that will become inactive are treated in such a way that the twin boundaries do not move when a magnetic field is applied to those regions. A local magnetic field of sufficiently high magnetic field energy capable of changing the twin variant configuration in the active region of the operating element is used to alter the local configuration of the twin variants in the active region while maintaining the overall volume fraction of twin variants within the active region. This active region can be further constrained between two parallel plates so that a special case of twin configuration, called a shrinkage, can be created, as will be shown below. Apparatus can be manufactured from thin films using lithography, laser cutting or carving, or other methods.

BRIEF DESCRIPTION OF THE DRAWINGS

FIG. 1a demonstrates a situation with a crystallographic c axis is along the horizontal direction. In this case, the active region is short in axial direction and the gripper is closed. FIG. 1b demonstrates a situation with a long crystallographic a axis is along the axial direction and the short c axis is perpendicular to the axial direction. In this case, the active region is long in horizontal direction and the gripper is open.

FIGS. 3a, 3b and 3c demonstrate multiple configurations of the twin variants in the active region with an equivalent volume fraction of twin variants.

FIG. 4a shows a situation where right side of the active region of the plate is contracted because it is composed of variant 2 with c axis along the plate in horizontal direction. The left side of the active region of the plate is elongated because it contains a wide area (grey) of variant 1 whose crystallographic long a axis is along the plate. FIG. 4b demonstrates how the variant configuration can be changed by using a local magnetic field aligned in the active plain and perpendicular to the horizontal direction of the element. Accordingly, Part 5 moves from right to left.

FIG. 5c shows an instance where the sides of the plate are made inactive (black area 3).

FIG. 7a shows the initial situation, FIG. 7b shows an intermediate situation and FIG. 7c shows the ultimate situation when the active region in the left side of part 5 is in single variant state with c axis in vertical direction and the active region in the right side of part 5 is in single variant state with c axis in horizontal direction.

DETAILED DESCRIPTION

Figure 1:
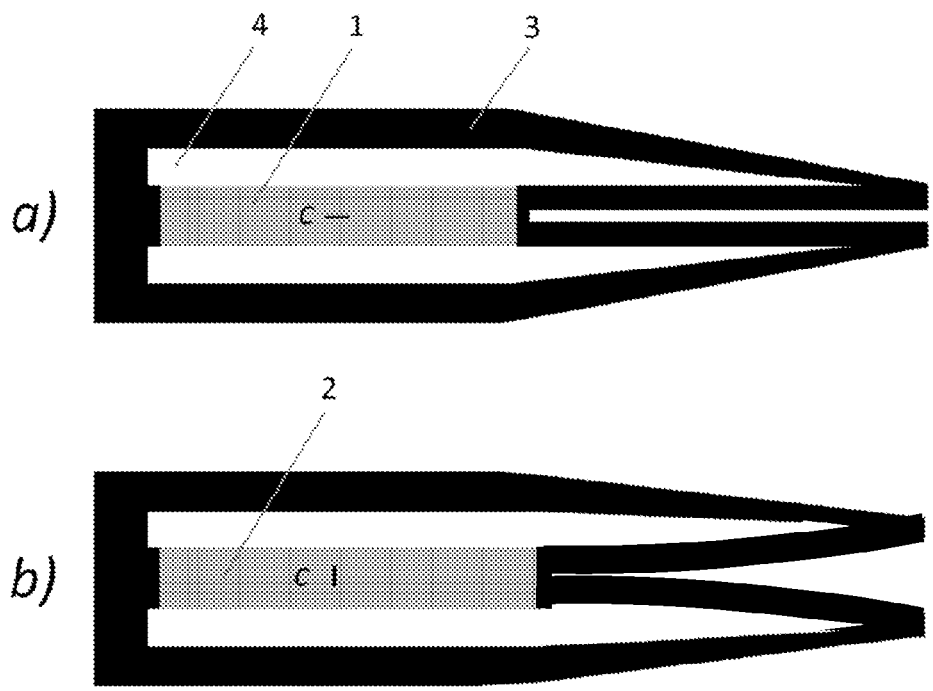
FIG. 1 schematically shows an example of a device made from a magnetic shape memory material. Some regions (3) of the plate, denoted by black, were made inactive. The active region of the plate (1 and 2) are denoted by grey.

The invention comprises a method for configuring twin variants and is related to an operational element made from an MSM material where a magnetic field is applied to, at least, one region of the apparatus, thus producing a shape change of that region of the apparatus, while the other regions of the apparatus do not strain in the applied magnetic field but they have other functions in the apparatus. The region where the magnetic-field-induced shape change takes place is called active region of the apparatus or region responsive to magnetic field. Other regions (areas or volumes) of the apparatus are treated or manufactured in such a way that their shape is not changed by the applied magnetic field. These regions, called inactive regions of the apparatus or regions unresponsive to a magnetic field, have other functions in the apparatus. Inactive regions can act as housing of the apparatus, springs, grippers, clamps, manipulators, injectors, mixers, pumps, valves, or manifolds, or parts of them. The inactive regions, as well as active regions also, may also contain cavities that may be fluidic channels or chambers, or parts of the channel or chambers. The active and inactive regions of the source piece of an MSM material can also be used for guiding the magnetic flux in the MSM apparatus. Inactive regions can be made using special surface treatments, e.g., deformation (shot peening, blasting or abrasive methods), laser treatments, or coating the surfaces with, for instance, metals, ceramics, polymers, as well as other methods. The regions can also be made inactive by mechanical clamping or pressing. The invention also relates to such apparatuses that are manufactured from polycrystalline or single crystalline MSM bulks, foils or thin films by removing material using different methods, such as chemical, electrochemical, electromachining, lithography, laser carving or cutting, ion beam milling or machining Said bulks, foils and thin films are hereinafter also called as a source piece of magnetic shape memory alloy or in a shorter way only as a source piece of alloy.

Any other manufacturing method that results in structures where some regions of the apparatus are inactive, and some other regions are active can be used for manufacturing the operating element of the MSM apparatus according to the invention. In active region, beneficial twin structure is usually dense. Dense twin structure can be stabilized by deforming at least one surface of the active region abrasively, shot peening, sand blasting, or by coating with an elastic coating.

This invention will simplify many devices across a variety of industrial applications, because an apparatus manufactured from a single source piece of an MSM material can replace complicated machinery consisted of separate parts. Major advantages of the apparatus according to the invention over magnetostrictive and piezo devices are about 100 times larger strain and the fact that the displacement created by the magnetic field stays after the magnetic field is switched off. The invention relates also to apparatus where the single source piece of an MSM material containing at least one active region and at least one inactive region is a part of the apparatus that contains also other functional parts made from other materials than MSM material or other functional parts that are made from an MSM material. For instance, embodiments of the invention can contain windings made from copper, or an apparatus may be a valve consisted of three parallel plates: the middle plate made from an MSM material (operating element) and the two other plates made from another material (containing the inlet and outlet holes) seal the fluid channel. These embodiments are described in detail below.

Some features of the invention are described below via selected examples. A gripper shown in FIG. 1 illustrates how inactive regions have a role in performing mechanical motion of the apparatus and why tailoring a proper twin variant structure in the source piece of the MSM material prior to manufacturing of the operating element is necessary. Prior to cutting the plate of the MSM material into a gripper, the plate was contracted in axial (horizontal) direction into a single variant state with the crystallographic short c axis lying in axial direction. Thereafter, the gripper was manufactured from the plate. Some regions (3) of the plate, denoted by black, can be made inactive by laser treatment. The active region of the plate (1 and 2) are denoted by grey. In the case shown in FIG. 1a, the gripper is closed because the active region was contracted in the axial direction prior to cutting of the gripper from the MSM plate. FIG. 1b demonstrates a situation when the gripper is open after the magnetic field with sufficient field strength was applied to the active region, resulting in extension of the active region where the long crystallographic a axis lies along the axial (horizontal) direction and the short crystallographic axis lies in vertical direction. The gripper closes by contracting the active region in axial direction due to the spring forces of the inactive regions. Different methods for controlling the motion of MSM apparatus according to the invention can be used. In small scale devices like grippers, optical methods like machine vision are useful methods for monitoring the motion and shape changes of the apparatus. This optical information can be used for controlling the motion of the apparatus.

In the apparatus according to the invention, recovery of the active region (contraction of elongation back to its original shape) can be done using an external force, applied magnetic field, spring forces caused by the inactive regions or by a thin layer of elastic coating or deformation on the surface of the active region, or by utilizing magnetic shape anisotropy of the sample, i.e., in thin foils magnetic field tends to align along the plane and in thin fibers the magnetic field tends to align in the long dimension of the fiber. The magnetic field caused by the magnetic shape anisotropy tends to contract the thin fiber or foil.

Figure 2:
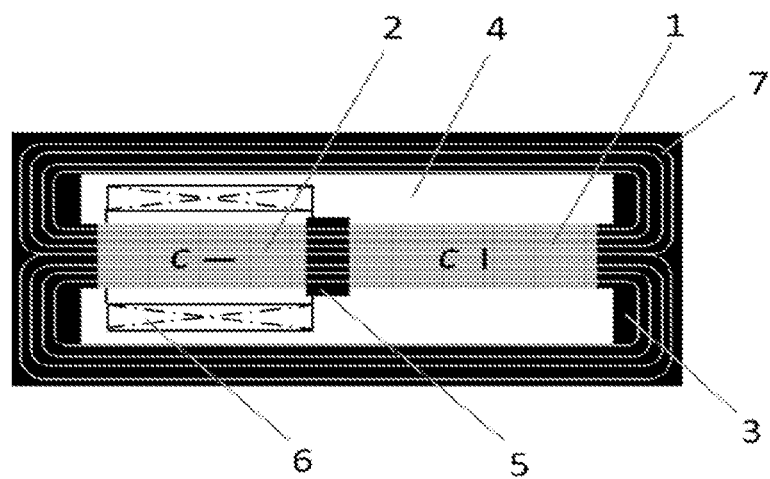
FIG. 2 schematically shows a plate made from a magnetic shape memory material in which the material is used as a flux path induced by an external magnetic field source (6). Twin variants are denoted by 1 and 2; the inactive region (black) of the plate is denoted by 3 and 5; air gap is denoted by 4; and flux lines are denoted by 7.

Active regions or inactive regions of the MSM apparatus can act as magnetic flux paths. FIG. 2 schematically illustrates a general feature of the invention how active regions and inactive regions can be used for conducting the magnetic flux induced by an external magnetic field source (6). Twin variants are denoted by 1 and 2; the inactive region (black) of the apparatus is denoted by 3 and 5; air gap is denoted by 4; and flux lines are denoted by 7.

The source piece of alloy or the MSM material, e.g., plate, foil or thin film, from which the operating element is manufactured can be in single variant state or multi variant state. Multi variant state may contain predetermined volume fractions of selected variants. A predetermined volume fractions of the twin variants can be tailored in the source piece of alloy prior to manufacturing the operating element from the source piece of the MSM material. Thereafter, the twin boundary motion in the entire source piece of the MSM material can be blocked by deforming at least on surface of the source piece of the MSM material by abrasion, shot peening or sand blasting, laser treatment, or by coating the surfaces with stiff enough coating. The operational element is then manufactured from the source piece of the MSM material using at least one of the following methods: machining, laser cutting or carving, lithography, etching, electromechanical machining, electrolysis. After manufacturing the operational element, twin boundary motion is unblocked in the active region by using one of the following methods: electropolishing, etching, sputtering or lapping at least one surface (side) of the active region. The proper twin structure, for instance, dense twin structure can be stabilized with at least one of the following methods: by deforming the surface of the active region with abrasion or shot peening, or by laser treatment; or by coating the surface with an elastic coating, or by maintaining part of the preceding deformation of the entire source piece of the MSM material. Alternatively, the operating element can be manufactured from such a source piece of the MSM material in which the twin boundary motion is not blocked. In this case, mobility of twin boundaries are blocked only in the operating element by deforming at least one surface of the inactive region by abrasion, shot peening or sand blasting, laser treatment, or by coating with stiff enough coating, or by mechanical constraining. The proper twin structure in the active region can be stabilized using the methods described above.

Figure 3:
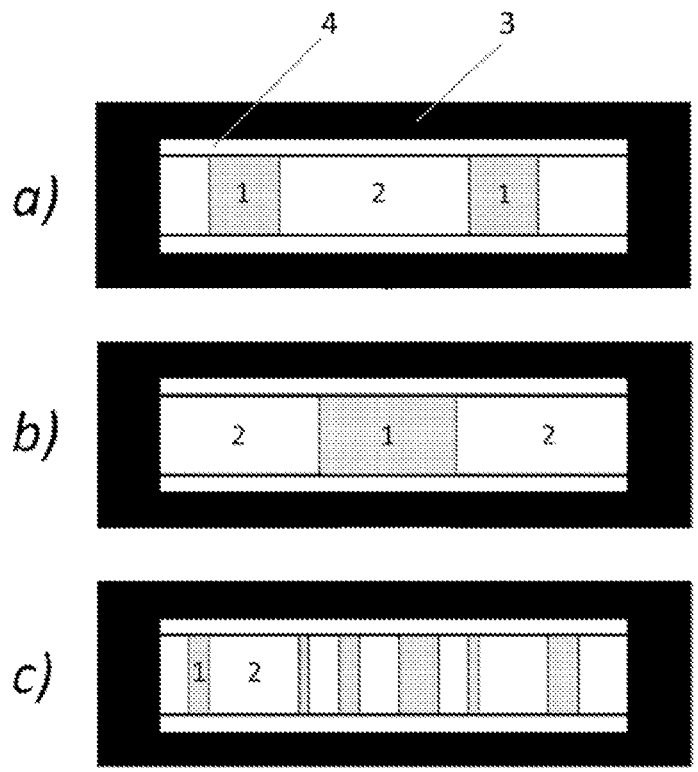
FIG. 3 schematically shows a top view of a plate made from a magnetic shape memory material. The source piece of alloy was strained leading to a desired volume fractions of twin variant 1 and twin variant 2. The surrounding region (black area 3) of the active region, composed of twin variants 1 and 2, were made inactive. The active area of the plate was constrained in the left and right sides of the element.

Active region can be surrounded by an inactive region. In this case, the overall elongation and contraction of the active region is constraint. A local magnetic field applied to the part of the active region can strain the active region locally, but the overall volume fraction in twin variants remains the unchanged. The axis along the MSM element that is orthogonal to the constrained ends is hereafter referred to as the axial direction, as shown in FIG. 3. FIG. 3 shows schematically the top view of the constrained MSM element with two twin variants of a predetermined volume fraction. FIG. 3 illustrates three different configurations with the same volume fractions of the twin variants 1 and 2. The volume fraction of variant 1 is approximately 30%. FIG. 3*a* shows two separate sections of variant 1. FIG. 3*b* shows one section of variant 1, and FIG. 3*c* shows several narrow sections of variant 1. Let us assume, for example, that the MSM element is made of the 10M martensite of Ni—Mn—Ga alloys. When a section of the active region is affected by a local magnetic field of sufficient strength in a direction within the active plane and either substantially parallel or substantially perpendicular to the horizontal (axial) direction, that section of the element shortens in the same direction as the magnetic field and elongates in a direction perpendicular to the direction of the magnetic field. Let us assume an element that contains variants 1 and 2, with the volume fractions of 30% and 70%, correspondingly, as illustrated in FIG. 4*a*. In this figure, the active plane is perpendicular to the surface of the figure and aligned along its axial direction. Let us further assume that the short crystallographic axis c of variant 1 is aligned in the active plane and perpendicular to the axial direction and the c axis of variant 2 is aligned in the active plane and in the axial direction. When a local magnetic field of sufficiently high strength, aligned in the active plane and perpendicular to the axial direction is applied to a section of the element that is initially of variant 2, the magnetic field turns the c axis orientation perpendicular to the axial direction, thus creating a new section of variant 1. If the magnetic field affects a section that covers at least 30% of the total volume of the element, then the volume fraction of the new section of variant 1 is 30%, and the original variant 1 shown in FIG. 4*a* becomes variant 2, because the total volume fraction of variant 1 is 30%. The resulting configuration is shown in FIG. 4*b*. This example illustrates one essential feature of the invention, i.e., that the volume fractions of the variants remain when the sections of the variants are reconfigured by applying local magnetic fields in different locations of the element. The sections can be of any width and quantity. It is possible to split broad sections into thin sections and vice versa. Sections can travel sequentially along the element in both directions or be moved discontinuously along the element. The sections can also be composed of type I or type II twins, and the element may contain both types of twins at the same time. When the active region is constrained, the volume fractions of the twin variants remain constant before, during and after changing the configuration of the twin variants. Once a new twin variant configuration is made, it stays even when the magnetic field is no longer applied to the element. The twin variant configuration can be made using short magnetic field pulses. This is of large practical importance because it prevents electromagnets from overheating and saves electric energy.

Figure 4:
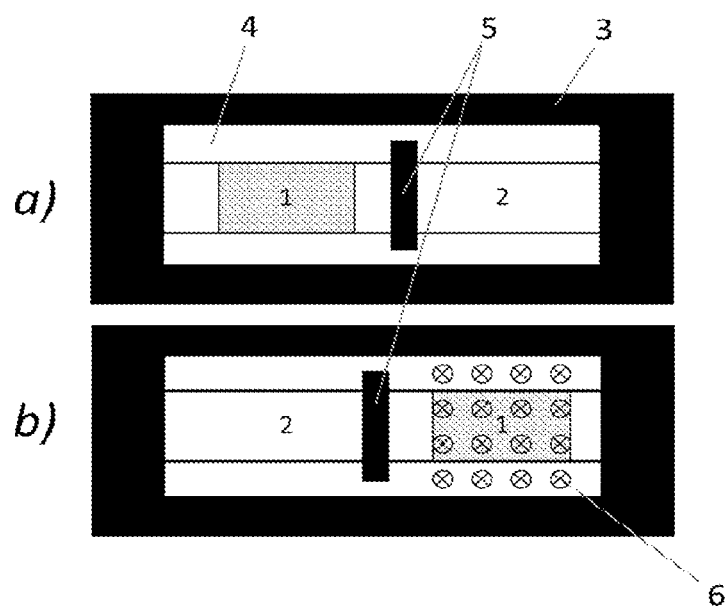
FIG. 4 schematically shows a top view of a plate made from a magnetic shape memory material with a predetermined volume fraction of twin variant 1 and 2. The plate was strained leading to a desired volume fraction of twin variant 1 and twin variant 2. After straining, the surrounding region of the element (black area 3) was made inactive. Part 5 was also made inactive.

The middle part (5) shown in FIG. 4 can be used for a variety of applications. It is also possible to attach other functional objects on the middle part to enhance the applicability. The middle part can, for instance act as latch valve. The middle part can have a hole that is moved in relation to another hole that is fixed. When holes are aligned coaxially, the flow can get through the holes maximally. When the holes move in relation to each other the flow is restricted and is stopped wholly when the holes are moved apart each other. The middle part can also be used for closing and opening electrical circuits. One switch can be attached in the middle part (5) and the second one in the frame (3) of the apparatus. Examples shown below illustrate these features.

As illustrated above using Ni—Mn—Ga as an example material, the twin variants can be configured by a local magnetic field of sufficient strength that is in a direction within the active plane and substantially perpendicular to the axial direction of the MSM element. Such a magnetic field can be generated by, for instance, an electromagnet or a permanent magnet. At least two local magnetic field sources may be applied simultaneously to different locations of the element, changing one variant into another at those locations. The local magnetic field sources can be successively applied to the element, hereafter meaning that the local magnetic field is applied sequentially without increasing in its width, along its axial direction, thus making a section of one twin variant travel along the element. The local magnetic field sources can also be applied continuously and successively to the element, hereafter meaning that the local magnetic field is applied sequentially while its previous areas are maintained so that the local magnetic field increases in its width, thus making a section of one twin variant broaden along the element. A magnetic field source may also be moved along the element thus changing the variant configuration in different locations of the element. The magnetic field sources may be placed on one side of the element or may be composed of parts that are placed on opposite sides of the element. At least one of the magnetic field sources can be an electromagnet. The electromagnets can form an array if they are placed beside each other and may cover the element wholly or partially. Using an array of electromagnets, the local magnetic fields can be applied to the element continuously and also successively. A similar array may also be placed on the opposite side of the element and may be connected to the electromagnets on the other side by a yoke. It is also possible to have the electromagnet on one side and a yoke on the other. Especially in thin and small structures, the windings can also be placed on at least one side of the element without a yoke, or the yoke may be a ferromagnetic plate placed on the opposite side of the element than the coils. In micro electromechanical structures (MEMS), the flat coils may be made using, e.g., lithographic techniques or laser cutting. When the coils are magnetized with short electric pulses, the coils do not heat significantly. Therefore, the current density in the coils can be high, which makes it possible to use smaller coils. In a small scale, the surface area to volume ratio is large, which also allows for higher current densities to be used in the coils. It is also possible to magnetize sections of the element in an axial direction. One embodiment of this is a coil wound around the element. In order to reach high enough magnetic fields in the element, the coils are most advantageous to be magnetized using electric current pulses.

Figure 5:
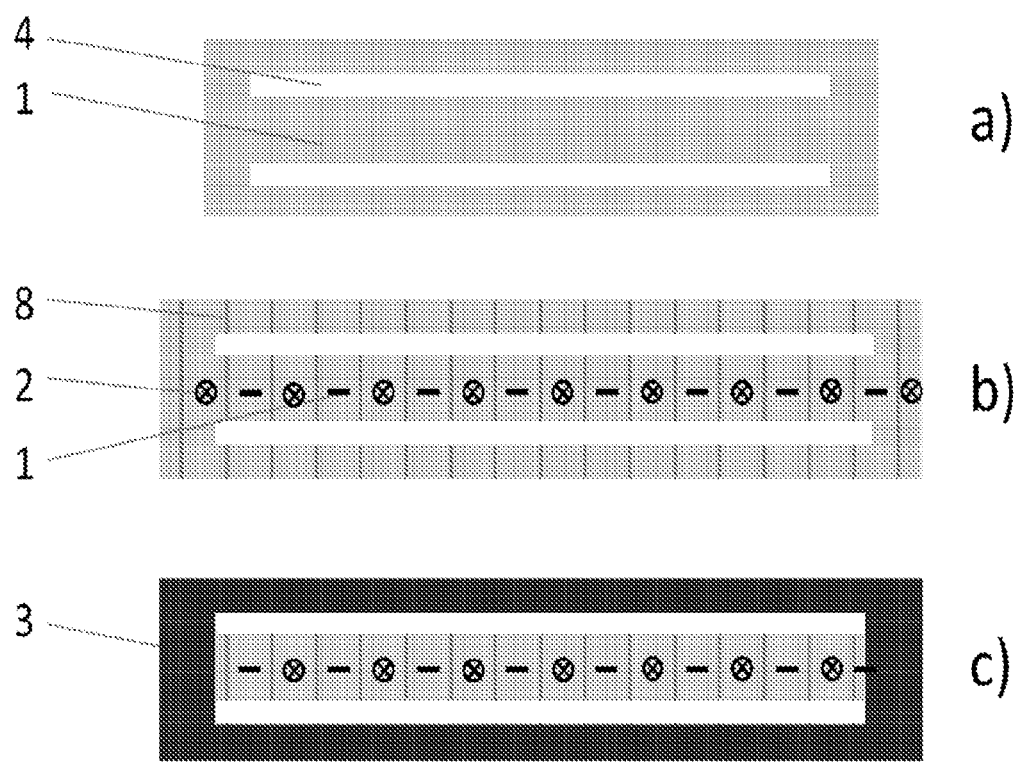
FIG. 5 schematically shows a plate made from a magnetic shape memory material in which two slits (4) were cut (FIG. 5a). The plate was strained leading to a desired volume fractions of twin variants (FIG. 5b). Twin boundaries between the variants are denoted by 8. The short crystallographic axis c of the variant is marked with a cross surrounded by a small circle in variant 2 (2) when the c axis is orthogonal to the figure plane and with a short horizontal line when the c axis is in the figure plane directed horizontally.

FIG. 5 shows an example that illustrates the invention. FIG. 5a shows a plate made of an MSM material with two slits (4) cut, e.g., with the use of laser or lithography. The plate is strained, e.g., by extension (FIG. 5b), or bending so that the plate consists of two variants with the short crystallographic axis c perpendicular to the plate surface (2) and parallel to the plate surface (1). Afterwards, the outer sides of the plate are treated in such a way that it becomes inactive (black area 3), as shown in FIG. 5c. The middle part of the plate was not treated and, therefore, is still respond to a magnetic field. The active region contains the same volume fractions of the twin variants as was present in the plate originally.

Figure 6:
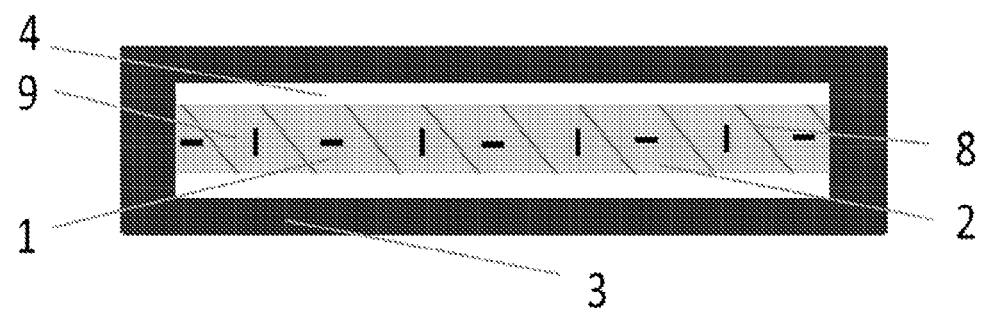
FIG. 6 schematically shows a plate made from a magnetic shape memory material in which two slits (4) were cut. The plate was strained leading to a desired volume fractions of twin variants. The sides of the plate were made inactive (black area 6). Twin boundaries between the variants are denoted by 8. The short crystallographic axis c is marked with a short line in variants 1 and 2.
Figure 7:
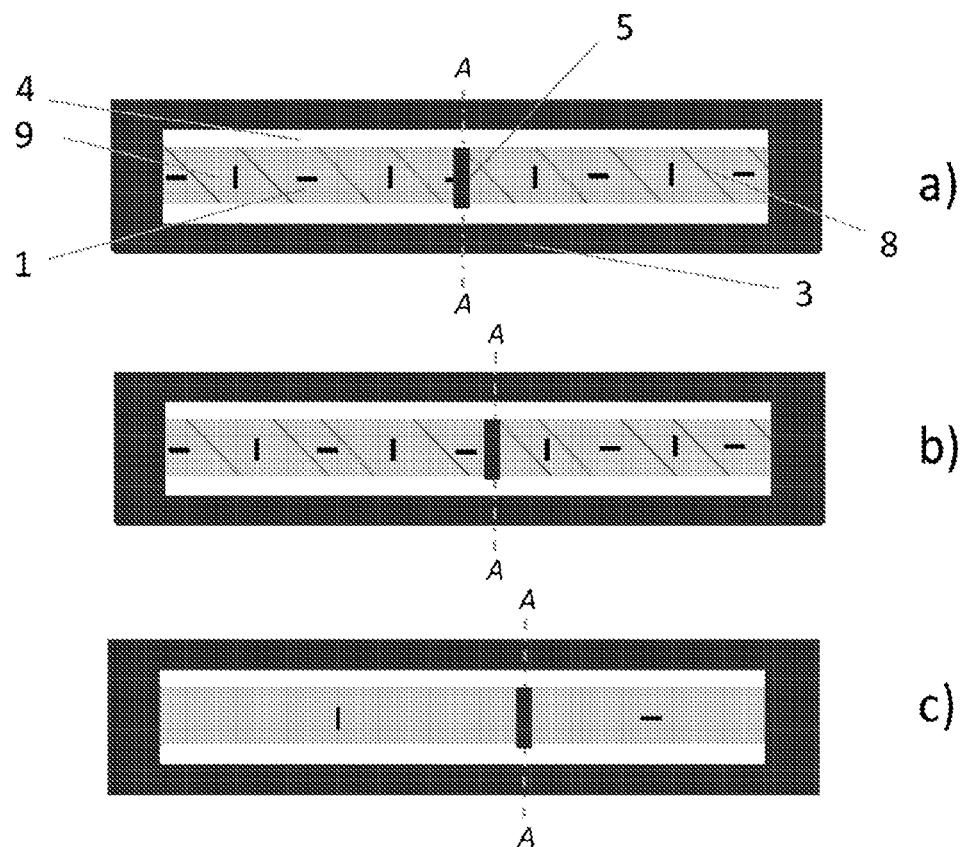
FIG. 7 shows three snapshots when the midline A-A and inactive part 5 is moved to the right.

The predetermined twin structure can also be made so that the c direction is switched in the plane that is parallel to the plane of the figure. It is also possible to do that after the sides of the plate are made inactive, e.g., with the use of the surface treatments, as illustrated in FIG. 6. Because the magnetic-field-induced dimensional changes of the element now occur in the figure plane, the width of the slits change. This can be used, for instance, in fluidic applications for pumping. It is also possible to make shrinkages or other shapes of sections in the slit areas. Those sections can be moved along the element and used in many applications, such as in fluidics for transferring fluids. FIG. 7 shows an example where the midline (A-A) of the element is moved to the right (FIG. 7b) leading to the increase of the volume fraction of the variants whose short c axis is in the axial direction in the right side of the midpoint, and to the decrease of them in the left side of the midpoint. FIG. 7c shows the ultimate situation in which in the right side of line A-A is entirely of one variant with c axis aligned in the axial direction, and in the left side of line A-A the structure is entirely of one variant with c axis aligned in vertical direction of the figure.

Twin boundaries between the twin variants in the active regions of the apparatus according to the invention can be of type I or type II. Twin boundaries of type II twins, e.g., in 10 M martensitic Ni—Mn—Ga alloys move at significantly lower magnetic field strengths than those of type I twins and their motion are less temperature dependent. Therefore, we prefer to use twins of type II in certain devices according to the invention. In 14M martensite, twin boundaries of type I and II move with quite a low magnetic field strengths. 14M martensite is useful for applications where operating temperatures are high because austenite start temperatures of the 14M martensites can be higher than the austenite start temperatures of the 10M martensites. It is emphasized that the invention is not limited to 10M or 14M martensite of Ni—Mn—Ga-based alloys only but to all such materials in which the MSM effect occurs. The invention simplifies complicated devices across a variety of industrial applications by replacing complicated machinery. Examples of the application areas are in optics, fluidics, micro engineering, robotics, manipulation and biomedicine. By changing the local twin variant configuration, the angle of the surface in relation to the axis of the element can be changed. This is useful for changing the angle of reflection of optics, which can be used for applications such as optical splitting, optical switching and interferometers. A continuous movement of the position of at least one shrinkage can be used to transport materials, such as fluids, along the MSM element, creating a pump or linear motor. Additionally, a discontinuous movement of the position of at least one shrinkage can be used to quickly switch between multiple shrinkage configurations, allowing for precise valve control and the ability to create manifolds. The invention is of special importance in micro- and nano-scale devices, because the entire apparatus containing several functional parts can be manufactured from one source piece of an MSM material.

The invention includes several uses of said method and apparatus. In the following sections, some examples of the use and applicability of the invention are presented. It is emphasized that the invention is not limited to those examples. The examples are shown primarily to illustrate some features of the invention.

Example 1

A gripper was made from a Ni—Mn—Ga foil of 0.1 mm in thickness. Foil was compressed in single variant state and thereafter surfaces of the foil were deformed by shot peening for blocking the twin boundary motion. Gripper similar to that schematically shown in FIG. 1 was cut from the sheet using a laser beam. Length of gripper was 5 mm and width of 2.6 mm After cutting, inactive regions were covered with a lacquer layer and the gripper was electropolished. Lacquer layer prevents electropolishing of the inactive regions. Active region was electropolished in such a way that part of the deformation by shot peening remains and stabilizes the dense twin structure that forms by the applied magnetic field. The operation of the gripper was demonstrated by applying a magnetic field on the active region.

Example 2

Figure 8A:
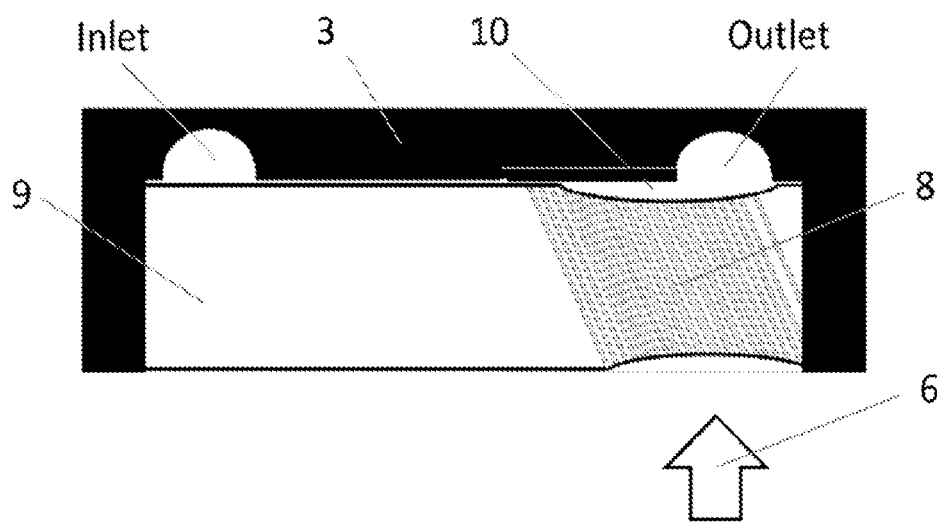
FIG. 8a schematically shows a cross sectional view of an example of a fluid controller. The shrinkage (10) travels along the active region (9) when a local substantially vertically aligned magnetic flux (6) moves from left to right transferring fluid from the inlet to outlet. The inactive area (3) of the apparatus acts as a frame of the pump.

FIG. 8a shows a principle of a pump that is made from a sheet Ni—Mn—Ga sheet. The active region (9) acts as a pumping element. Ratio of twin variants 1 and 2 is 70% and 30%. External local magnetic field (6) creates a shrinkage in the active region. The shrinkage (10) travels along the active region (9) when a local substantially vertically aligned magnetic flux (6) moves from left to right transferring fluid from the inlet to outlet. The inactive area (3) of the apparatus acts as frame of the pump.

Figure 8B:
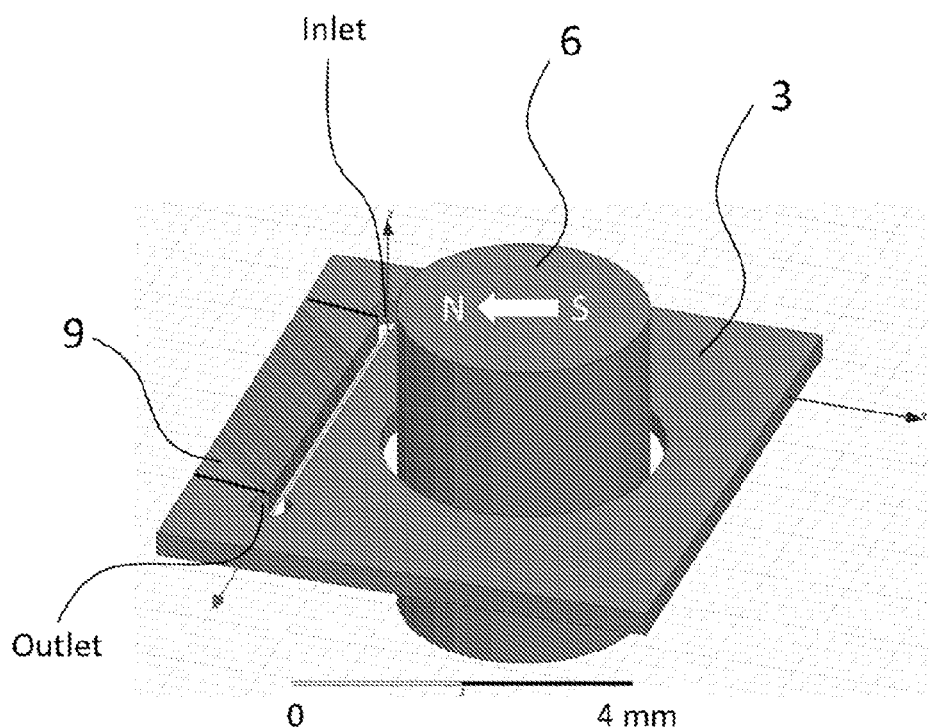
FIG. 8b shows a pump that was made from a thin Ni—Mn—Ga sheet. A dense twin structure with equal proportions of twin variants 1 and 2 was made in the sheet prior to laser cutting of the sheet into the form of the pump that is shown in the figure. Thereafter, twin boundary motion was blocked by laser treating the surfaces of the inactive region (3). Active region (9) was slightly shot peened for keeping the dense twin structure. Figure shows the pump before the shrinkage was created in the active region by rotating the diametrically magnetized permanent magnet (6). In this pump design, the inactive area (3) of the apparatus acts as frame of the pump. The apparatus was sealed with an elastomer which is not shown in the figure.
Figure 9:
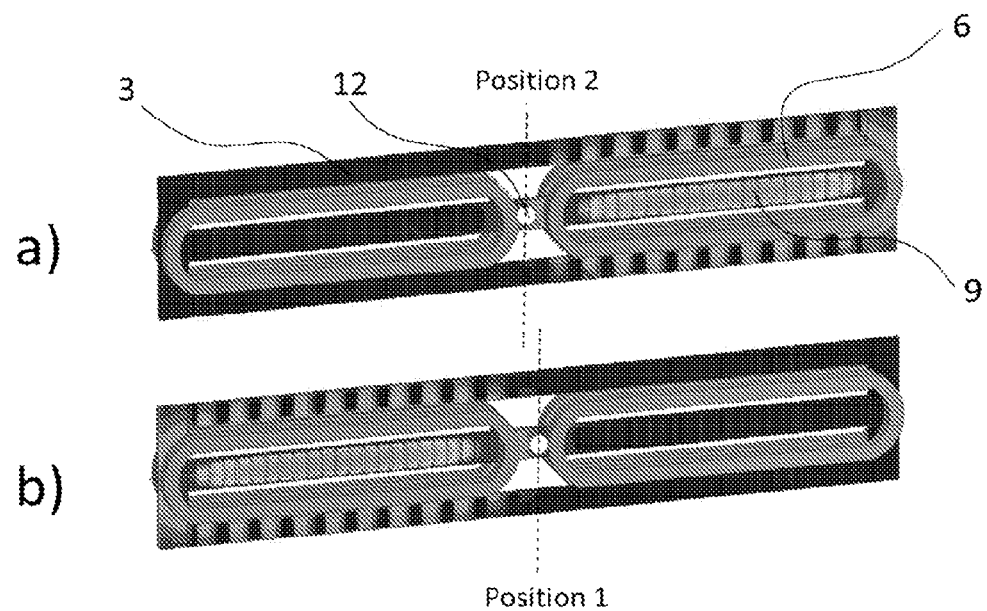
FIG. 9 schematically shows a cross sectional view of a fluidic valve or an optical switch. Active region is denoted by 9 and the inactive region by 3. The flow of the fluid or a light beam passes through the hole (12) that is moved by the active region 9.

FIG. 8b shows another embodiment of a pump that was made from a Ni—Mn—Ga sheet. A dense twin structure with equal proportions of the twin variants 1 and 2 was made in the sheet prior to laser cutting of the sheet into the form of the pump that is shown in the figure. Thereafter, twin boundary motion was blocked by laser treating the surfaces of the inactive region (3). Active region (9) was slightly shot peened for keeping the dense twin structure. FIG. 8b shows the operational element of the pump before the shrinkage was created in the active region by rotating the diametrically magnetized permanent magnet (6). In this pump design, the inactive area (3) of the apparatus acts as a frame of the pump. The apparatus was sealed with an elastomer which is not shown in the FIG. 8b.

Example 3

If an element is constrained between an object, e.g., a plate or a bar, with a substantially planar surface and another substantially planar surface as well as having both ends constrained, the object can move in the axial direction of the element when at least one local magnetic field source is applied to the element. This is based on the fact that the dimensions of the element change locally. For instance, in the 10 M martensite of Ni—Mn—Ga alloys, the element elongates in the axial direction in those locations where it shrinks in the perpendicular direction. When the shrinkage travels along the element, the planar surface placed on the element moves along the element. This is a principle of a linear motor whose operation was demonstrated.

Example 4

The apparatus may be a microfluidic device, e.g., a lab-on-a-chip. Cavities for the microfluidic channels and chambers can be made in the apparatus, for instance, in its inactive parts. Pumps, valves, manifolds, mixers and other devices can be made in the active parts of the same source piece of the MSM material. One embodiment of the lab-on-chip according to the invention is composed of the MSM plate placed between two polymeric plates that may also contain fluid channels and chambers.

Example 5

FIG. 10 shows an embodiment of an apparatus that can be used, for instance, as a fluidic valve or an optical switch. Hole (12) is moved from one end (position 1) towards the other end (position 2) fully or partially depending the applied magnetic field strength. Thus, the opening for the path of the fluidic flow or the light beam could be full or partial. Active region is denoted by 9 and the inactive region by 3. The apparatus was made from a Ni—Mn—Ga sheet by laser machining. Prior to cutting the apparatus from the Ni—Mn—Ga sheet, a narrow twin structure with 50-50 twin variant proportions was created by bending the sheet. The apparatus was cut from the sheet using a laser beam. Twin boundary motion in the inactive regions, frame (3) of the apparatus and part (5), were blocked using a laser treatment of the surface. FIG. 10a shows a magnetic flux distribution in the active region of the apparatus and also in the inactive region (frame of the apparatus) when the active region on right is magnetized with a magnetic field pulse led to the coil. FIG. 10b shows similar situation when the active region on left is magnetized. This example demonstrates that the inactive regions of the apparatus also conduct the magnetic flux in the apparatus according to the invention. The computer modeling of the apparatus well corresponded to experimental data measured for the apparatus. Switching between positions 1 and 2 occurs in a few microseconds.

Example 6

The apparatus can be an electrical switch or circuit breaker. One embodiment of such a switch was made from a sheet of a Ni—Mn—Ga alloy using laser machining. The construction and working principle of the apparatus were similar to the apparatus shown in FIG. 10. Difference to the apparatus shown in FIG. 10 is that the back and forth motion of part (5) was used for opening and closing the electrical contact. The electrical contacts were electrically insulated from the apparatus. Switching time was measured to be few microseconds. Electrical switches and circuit breakers according to the invention have a great commercial potential especially in microelectronics for switching electrical currents of high frequency.

Example 7

The apparatus according to the invention may contain at least one active region whose shape is changed by bending or kinking in an applied magnetic field. Bending can be performed by applying an inhomogeneous magnetic field of sufficient field strength to the active region. Bending occurs also in substantially homogeneous magnetic field if one surface of the active region is made inactive and other side is remained active. Active side strains by the magnetic field and the inactive side does not strain, which leads to a bending deformation of the active region. The apparatus may also contain several active regions that bend in the applied magnetic field. This type of apparatus can be used, e.g., for mixing fluids.

It is emphasized that all examples shown above are presented for just illustrating certain features of the invention. The invention is not limited to those examples only.

The invention claimed is:

1. A method for manufacturing an operational element for using alone or as a part of an apparatus, which operational element comprises as a source piece a magnetic shape memory alloy with a twin variant structure having a boundary between the variants, characterized in that
   a) prior to manufacturing the operational element from the source piece, and prior to creating active and inactive regions into the source piece, such a predetermined twin variant structure is created to the source piece of the magnetic shape memory (MSM) alloy that the active region to be created or a part of it produces magnetic-field-induced shape change required for performing its function in the operational element,
   b) at least a part of the source piece, from which the operational element is manufactured, is arranged as an active region that is responsive to a magnetic field for carrying out functions in the operational element which functions require producing of shape changes, and
   c) at least one other part of the same source piece is arranged as an inactive region by treating the part in such a way that the twin boundaries between the twin variants do not move when a magnetic field is applied to those inactive regions in the operational element.

2. The method for manufacturing an operational element of claim 1, wherein the active and/or inactive regions are formed to carry out at least one or more of the following functions: acting as the frame of the operational element; conducting magnetic flux; creating a spring force, advantageously for recovering the shape change of the active region; conducting electric current; switching electric current; acting as a clamp; acting as an optical shutter; acting as a valve; acting as a manifold; acting as a part of a microfluidic chip containing fluid channels or chambers; producing shape change in the region.

3. The method for manufacturing an operational element of claim 1, wherein the source piece of the MSM material containing at least one active region and at least one inactive region is a part of an apparatus that contains also other functional parts made from other materials than MSM material or other functional parts that are made from an MSM material.

4. The method for manufacturing an operational element of claim 1, wherein the source piece of alloy is compressed or elongated into a single variant state using a magnetic field or mechanical force.

5. The method for manufacturing an operational element of claim 1, wherein preferably two twin variants are created with predetermined volume fractions in the source piece of alloy.

6. The method for manufacturing an operational element of claim 5, wherein in the source piece of alloy the two twin variants 1 and 2 are created and the volume fraction of the variant 1 is at least 10%.

7. The method for manufacturing an operational element of claim 6, wherein in the source piece of alloy the volume fraction of the two twin variants is fitted to substantially 50-50%.

8. The method for manufacturing an operational element of claim 5, wherein in the source piece of alloy the twin variants are made equally distributed.

9. The method for manufacturing an operational element of claim 5, wherein in the source piece of alloy the twin structure is made dense containing thin twins.

10. The method for manufacturing an operational element of claim 5, wherein in the source piece of alloy the twin structure is stabilized with surface treatments, preferably with one of the following methods: by deforming the surface of the active region with abrasion or shot peening; by laser treatment; by coating the surface with an elastic coating.

11. The method for manufacturing an operational element of claim 1, wherein the mobility of the twin boundaries in the entire source piece of alloy is blocked by surface treatments, preferably deforming one surface of the source piece of alloy by abrasion; shot peening or sand blasting; laser treatment; or by coating with stiff enough coating.

12. The method for manufacturing an operational element of claim 11, wherein the operational element is manufactured from the source piece of alloy using preferably one of the following methods: machining; laser cutting or carving; lithography; etching; electromechanical machining; electrolysis.

13. The method for manufacturing an operational element of claim 12, wherein the twin boundary motion is unblocked in the active region preferably by using one of the following methods: electropolishing; etching;
sputtering or lapping at least one surface of the active region.

14. The method for manufacturing an operational element of claim 13, wherein the twin structure is stabilized with surface treatments, preferably with one of the following methods: by deforming the surface of the active region with abrasion or shot peening; or by laser treatment; or by coating the surface with an elastic coating; or by maintaining part of the preceding deformation of the entire source piece of alloy.

15. The method for manufacturing an operational element of claim 1, wherein the operational element is manufactured from the source piece of alloy, in which mobility of the twin boundaries is not blocked with any method.

16. The method for manufacturing an operational element of claim 15, wherein the mobility of twin boundaries in inactive regions is blocked by surface treatments, preferably deforming at least one surface of the inactive region by abrasion, shot peening or sand blasting, laser treatment, or by coating with stiff enough coating, or by mechanical constraining.

17. An operational element for using alone or as a part of an apparatus, which operational element comprises a magnetic shape memory alloy with a twin variant structure having a boundary between the variants, characterized in that
   a) at least a part of the operational element is an active region that is responsive to a magnetic field for carrying out functions in the operational element which functions require producing of shape changes,
   b) at least one other part of the operational element is an inactive region that is unresponsive to a magnetic field for carrying out other functions in the operational element, and
   c) the operational element has a predetermined twin variant structure where the mobility of twin boundaries between the variants has been arranged so that in the active regions the twin boundaries move for producing a desired shape change of the active region and in the inactive regions the twin boundaries do not move when a magnetic field is applied to those regions in the operational element.

18. The operational element of claim 17, wherein the active and/or inactive regions have a form to carry out at least one or more of the following functions: acting as the frame of the operational element; conducting magnetic flux; creating a spring force, advantageously for recovering the shape change of the active region; conducting electric current; switching electric current; acting as a clamp; acting as an optical shutter; acting as a valve; acting as a manifold; acting as a part of a microfluidic chip containing fluid channels or chambers; producing shape change in the region.

19. The operational element of claim 17, wherein the operational element of the MSM material containing at least one active region and at least one inactive region is a part of an apparatus that contains also other functional parts made from other materials or other functional parts made from an MSM material.

20. The operational element of claim 17, wherein the source piece of alloy has been compressed or elongated into a single variant state.

21. The operational element of claim 17, wherein the source piece of alloy comprises preferably two twin variants.

22. The operational element of claim 21, wherein the source piece of alloy comprises two twin variants and the volume fraction of the other variant is at least 10%.

23. The operational element alloy of claim 22, wherein in the source piece of alloy the volume fraction of the two twin variants is substantially 50-50%.

24. The operational element of claim 17, characterized in that that wherein in the source piece of alloy the twin variants are equally distributed.

25. The operational element of claim 17, wherein in the source piece of alloy the twin structure has dense containing thin twins.

26. The operational element of claim 17, wherein the twin structure in at least one active region has been stabilized.

27. The operational element of claim 17, wherein the mobility of the twin boundaries in the entire source piece of alloy has been blocked by surface treatments, preferably by deforming at least one surface of the source piece of alloy.

28. The operational element of claim 17, wherein the operational element has been manufactured from the source piece of alloy using preferably one of the following methods: machining; laser cutting or carving; lithography; etching; electromechanical machining; electrolysis.

29. The operational element of claim 17, wherein a local magnetic field applied to the active region of the operational element is generated using at least one electromagnet.

30. The operational element of claim 17, wherein the magnetic field source is an array of electromagnets placed beside each other covering the element wholly or partially.

31. The operational element of claim 17, wherein at least one of the magnetic field sources is a permanent magnet.

32. The operational element of claim 17, wherein the magnetic shape memory material is a Heusler alloy, preferable 10M or 14M martensite containing Ni, Mn and Ga merely or among other elements.

33. The operational element of claim 17, wherein twin boundaries in the operational element are of type I or type II.

* * * * *